US010511272B2

United States Patent
Lyalin (10) Patent No.: US 10,511,272 B2
(45) Date of Patent: Dec. 17, 2019

(54) POWER AMPLIFIER BIAS CIRCUIT WITH A MIRROR DEVICE TO PROVIDE A MIRROR BIAS SIGNAL

(71) Applicant: SKYWORKS SOLUTIONS, INC., Woburn, MA (US)

(72) Inventor: Aleksey A. Lyalin, Moorpark, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/943,938

(22) Filed: Apr. 3, 2018

(65) Prior Publication Data

US 2018/0226925 A1     Aug. 9, 2018

Related U.S. Application Data

(63) Continuation of application No. 14/867,178, filed on Sep. 28, 2015, now Pat. No. 9,935,593.

(60) Provisional application No. 62/057,227, filed on Sep. 29, 2014.

(51) Int. Cl.

| H03F 3/04 | (2006.01) |
|---|---|
| H03F 3/21 | (2006.01) |
| H03F 1/30 | (2006.01) |
| H03F 3/191 | (2006.01) |
| H03F 3/50 | (2006.01) |
| H03F 3/72 | (2006.01) |

(52) U.S. Cl.
CPC ............ *H03F 3/211* (2013.01); *H03F 1/302* (2013.01); *H03F 3/191* (2013.01); *H03F 3/50* (2013.01); *H03F 3/72* (2013.01); *H03F 2200/111* (2013.01); *H03F 2200/451* (2013.01); *H03F 2203/21127* (2013.01); *H03F 2203/21145* (2013.01); *H03F 2203/21175* (2013.01); *H03F 2203/45154* (2013.01); *H03F 2203/7209* (2013.01); *H03F 2203/7236* (2013.01)

(58) Field of Classification Search
CPC .......... H03F 3/211; H03F 1/302; H03F 3/191; H03F 3/50; H03F 3/72
USPC ........................................... 330/296, 285, 85
See application file for complete search history.

(56) References Cited

U.S. PATENT DOCUMENTS 7,259,615 B2 *   8/2007   Sasho ..................... G05F 3/205
                                                                327/540

* cited by examiner

*Primary Examiner* — Khanh V Nguyen
*Assistant Examiner* — Khiem D Nguyen
(74) *Attorney, Agent, or Firm* — Chang & Hale LLP (57) ABSTRACT

A bias circuit for power amplifiers is disclosed. A power amplifier bias circuit can include an emitter follower device and an emitter follower mirror device coupled to form a mirror configuration. The emitter follower device can be configured to provide a bias signal for a power amplifier at an output port. The power amplifier bias circuit can include a reference device configured to mirror an amplifying transistor of an amplifying device of the power amplifier. The emitter follower mirror device can be configured to provide a mirror bias signal to the reference device. A node between the emitter follower device and the emitter follower mirror device can have a voltage of approximately twice a base-emitter voltage (2Vbe) of the amplifying transistor.

20 Claims, 8 Drawing Sheets

POWER AMPLIFIER BIAS CIRCUIT WITH A MIRROR DEVICE TO PROVIDE A MIRROR BIAS SIGNAL

CROSS-REFERENCE TO RELATED APPLICATION(S)

This application is a continuation of U.S. application Ser. No. 14/867,178 filed Sep. 28, 2015, entitled "POWER AMPLIFIER BIAS CIRCUIT," which claims priority to U.S. Provisional Application No. 62/057,227 filed Sep. 29, 2014, entitled BIAS CIRCUIT FOR POWER AMPLIFIERS, the disclosure of each of which is hereby expressly incorporated by reference herein in its entirety for all purposes.

BACKGROUND

Field

The present disclosure generally relates to power amplifier bias circuits.

Description of the Related Art

A power amplification system can include a power amplifier and a bias circuit configured to provide a bias signal to the power amplifier. Variations in the manufacturing process can result in undesirable variation in the bias signal, e.g. current variations or voltage variations.

SUMMARY

In accordance with some implementations, the present disclosure relates to a power amplifier bias circuit. The power amplifier bias circuit includes an emitter follower device and an emitter follower mirror device coupled to form a mirror configuration. The emitter follower device configured to provide a bias signal for a power amplifier at an output port. The power amplifier bias circuit further includes a reference device configured to mirror an amplifying device of the power amplifier. The emitter follower mirror device is configured to provide a mirror bias signal to the reference device.

In some embodiments, the emitter follower device can include an emitter follower transistor, the emitter follower mirror device can include an emitter follower mirror transistor, and the emitter follower transistor and emitter follower mirror transistor can be coupled by their respective bases to form the mirror configuration.

In some embodiments, a current through the amplifying device can be proportional to a current through the reference device.

In some embodiments, the reference device can be a reference transistor configured to mirror an amplifying transistor of the amplifying device. In some embodiments, the emitter follower device can be configured to provide the bias signal to a base of the amplifying transistor and the emitter follower mirror device can be configured to provide the mirror bias signal to a base of the reference transistor.

In some embodiments, a node between the emitter follower device and the emitter follower mirror device can have a voltage of approximately twice a base-emitter voltage (2Vbe) of the amplifying transistor.

In some embodiments, the power amplifier bias circuit further includes a source follower device having an output coupled to the node. In some embodiments, the source follower device can be configured as a zero shift buffer. In some embodiments, the source follower device can include a source follower field-effect transistor (FET).

In some embodiments, the power amplifier bias circuit further includes a second FET having a drain coupled to a source of the source follower FET. In some embodiments, the power amplifier bias circuit further includes a capacitor coupled between the node and a ground potential. In some embodiments, the power amplifier bias circuit further includes an output resistor coupled between the emitter follower device and the output port. In some embodiments, the power amplifier bias circuit further includes a reference resistor coupled between the emitter follower mirror device and the reference device.

In some embodiments, the power amplifier bias circuit further includes an input port configured to receive at least one of a reference voltage or a reference current. In some embodiments, the power amplifier bias circuit further includes an enable circuit coupled between the input port and the reference device.

In some implementations, the present disclosure relates to a radio-frequency (RF) module including a packaging substrate configured to receive a plurality of components. The RF module includes a power amplification system implemented on the packaging substrate. The power amplification system includes an amplifying device and a power amplifier bias circuit. The power amplifier bias circuit is configured to provide a bias signal to the amplifying device. The power amplifier bias circuit includes an emitter follower device and an emitter follower mirror device coupled to form a mirror configuration. The power amplifier bias circuit further includes a reference device configured to mirror the amplifying device.

In some embodiments, the amplifying device can include an amplifying transistor and the emitter follower device can be configured to provide the bias signal to a base of the amplifying transistor.

In some embodiments, the emitter follower device can include an emitter follower transistor, the emitter follower mirror device can include an emitter follower mirror transistor, and the emitter follower transistor and emitter follower mirror transistor can be coupled by their respective bases to form the mirror configuration.

In some embodiments, the power amplifier bias circuit can further include includes a source follower device coupled to a node between the emitter follower device and the emitter follower mirror device.

In some implementations, the present disclosure relates to a wireless device including a transceiver configured to generate a radio-frequency (RF) signal. The wireless device includes an RF module in communication with the transceiver. The RF module includes a power amplification system configured to amplify the RF signal. The power amplification system includes an amplifying device and a power amplifier bias circuit configured to provide a bias signal to the amplifying device. The power amplifier bias circuit includes an emitter follower device and an emitter follower mirror device coupled to form a mirror configuration. The power amplifier bias circuit further includes a reference device configured to mirror the amplifying device. The wireless device further includes an antenna in communication with the RF module. The antenna is configured to transmit the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
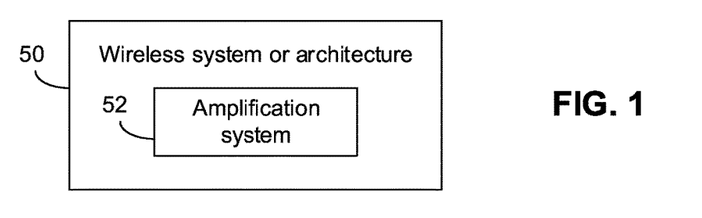
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
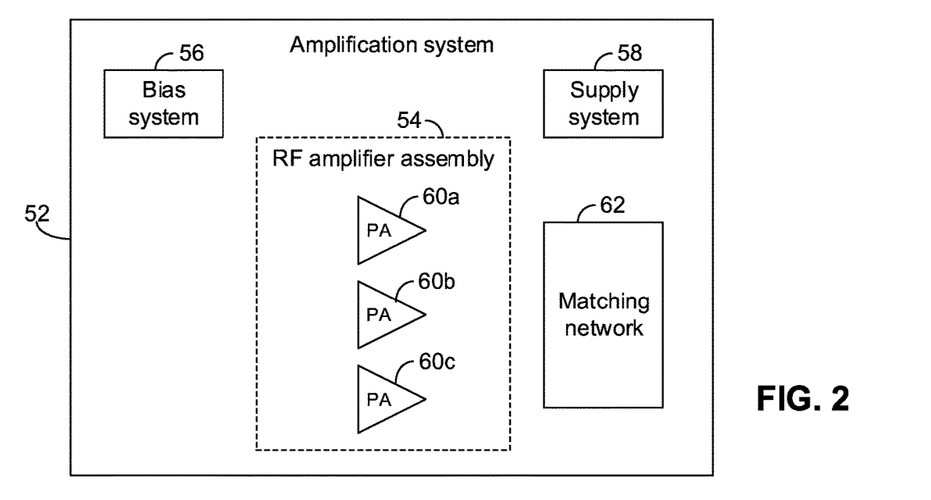
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
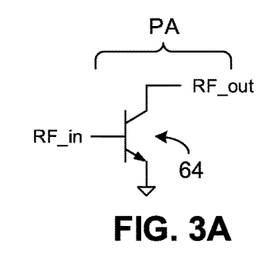
FIGS. 3A, 3B, 3C, 3D, and 3E show non-limiting examples of power amplifiers.

For the purpose of description, it will be understood that each PA (60a-60c) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
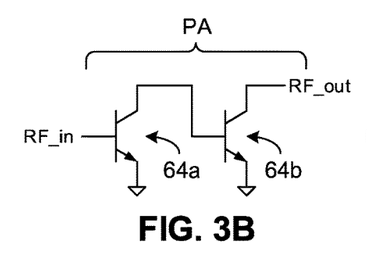

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
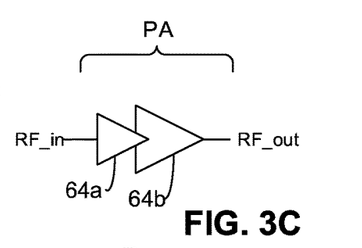

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
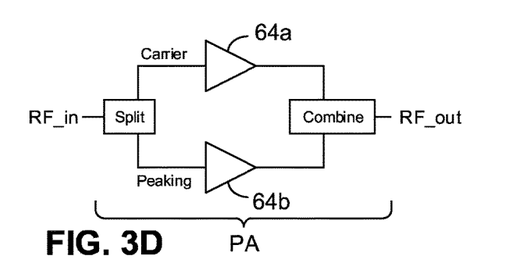

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
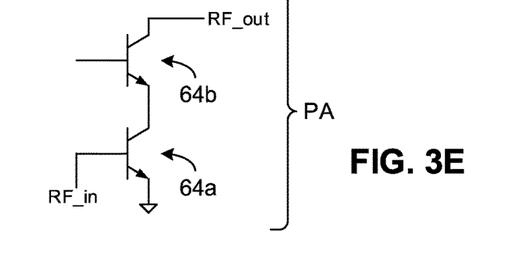

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

There can be a number of advantages in utilizing a 2Vbe bias circuit in PA applications (e.g., in the bias system 56 of FIG. 2). For example, a significant benefit of using a 2Vbe bias circuit can include a linearization effect due to rectification of radio-frequency (RF) signals by a base-emitter junction of an emitter follower within the bias circuit. In some embodiments, a power amplification system includes a bias circuit having two diodes and an emitter follower.

Figure 4:
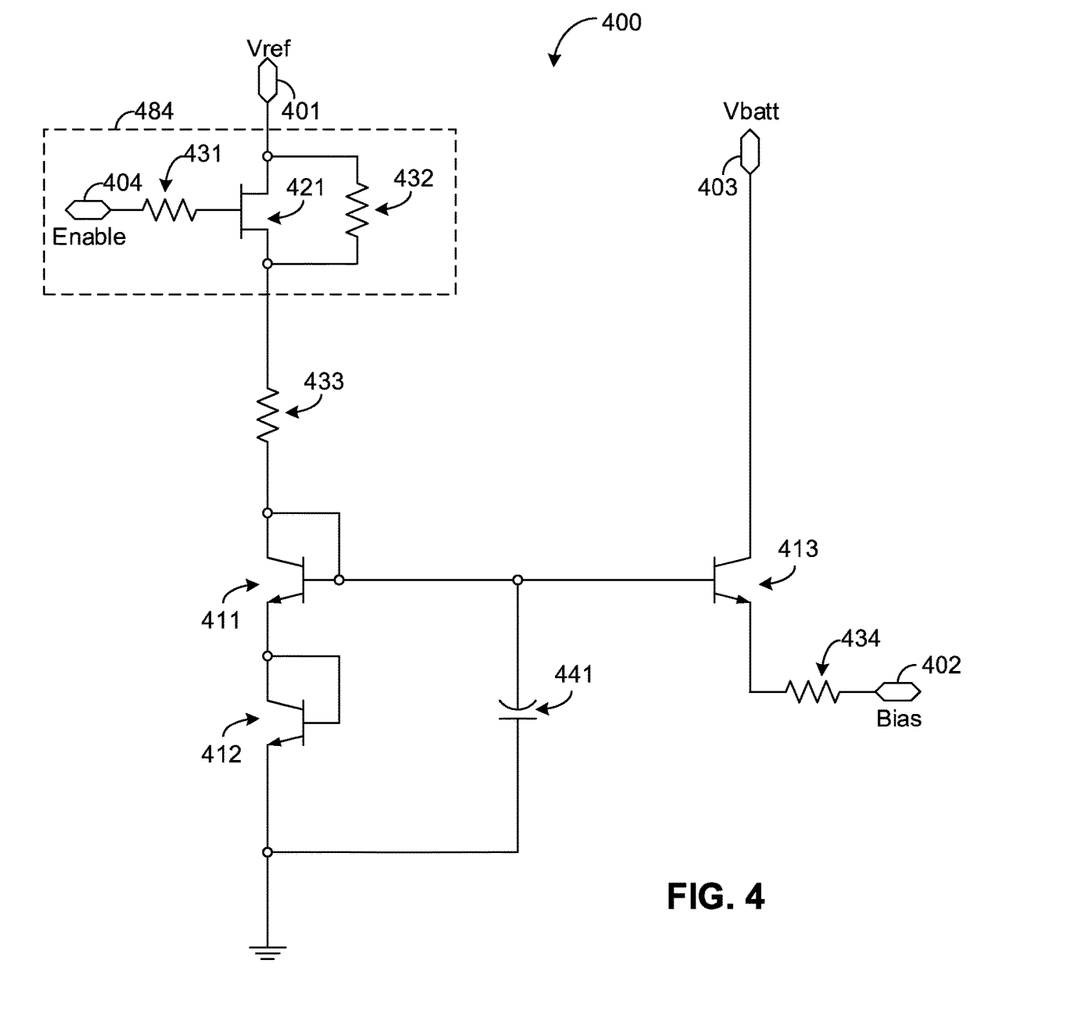
FIG. 4 shows an example of 2Vbe bias circuit having two transistors in a diode configuration.

FIG. 4 shows an example of 2Vbe bias circuit 400 having two transistors 411, 412 in a diode configuration. In some embodiments, one or both of the transistors 411, 412 can be replaced with one or two diodes. The bias circuit 400 also includes a transistor 413 configured as an emitter follower. The bias circuit receives, at an input port 401, a reference voltage (Vref) and supplies, at an output port 402, a bias signal. The bias signal can be, for example, a bias current and/or a bias voltage. The bias circuit 400 is powered by voltage received from a battery (Vbatt) or other source at a power port 403. The bias circuit 400 further includes an enable circuit component 484 including a field-effect transistor (FET) 421. The gate of the FET 421 is coupled, via a first resistor 431 to an enable port 404. The source and drain of the FET 421 are coupled via a second resistor 432.

The bias circuit 400 further includes a third resistor 433 coupled between the input port 401 and the two transistors 411, 412 in a diode configuration and a fourth resistor 434 coupled between the output port 402 and the transistor 413 configured as an emitter follower.

The base of the transistor 413 configured as an emitter follower is coupled to a ground potential by a capacitor 441. During operation, the voltage at the base of the transistor 413 configured as an emitter follower is approximately twice the base-emitter voltage of the transistors, e.g., 2Vbe. The base-emitter voltage can be, for example, between approximately 0.6 volts (V) and approximately 0.7 V for silicon transistors or other values for other transistor types. As noted above, in such a bias circuit, there may be a linearization effect due to rectification of RF signals by the base-emitter junction of the transistor 413 configured as an emitter follower. In particular, improved linearization of AM-to-AM and AM-to-PM conversion is substantially similar to other 2Vbe bias circuits.

It is noted that there can be issues with a 2Vbe bias circuit 400 such as the example of FIG. 4. For example, both closed form solutions using Ebers-Moll equations and simulations show strong dependence of the bias circuit 400 on transistor beta (e.g., the ratio of the collector current to the base current or the DC current gain). In particular, in the bias circuit 400 of FIG. 4, the collector-emitter current through the transistor 413 configured as an emitter follower is is proportional to the square root of beta. In a typical HBT (heterojunction bipolar transistor) manufacturing process, tolerance of ±35% current variation can result just due to beta, and ±50% variation can result when one includes other factors such as CMOS (complementary metal-oxide semiconductor) Vref range, TaN, and Vbe variations. Further, significant variation of beta is possible even within a given wafer.

It is further noted that some 2Vbe circuits limit Vref headroom to approximately 0.4 V. Thus, even using a CMOS current source as the reference input for the bias circuit may introduce variation and other issues. Further, a low battery voltage (e.g., 2.9 V) or variations in the battery voltage can also present a CMOS design challenge.

In some embodiments, a bias circuit can include a number of desirable features that address some or all of the foregoing issues. For example, such a bias circuit can be configured to eliminate or reduce dependence of the quiescent current of a power amplifier on the beta of the HBT process. In another example, the bias circuit can be configured to improve voltage headroom of the sink node and reduce dependence on Vbatt variations. In some embodiments, such a bias circuit can include a configuration where an emitter follower and RF stage are mirrored. In some embodiments, a reference current is set by a source follower loop. In some embodiments, a reference current is provided by a CMOS current source.

Figure 5:
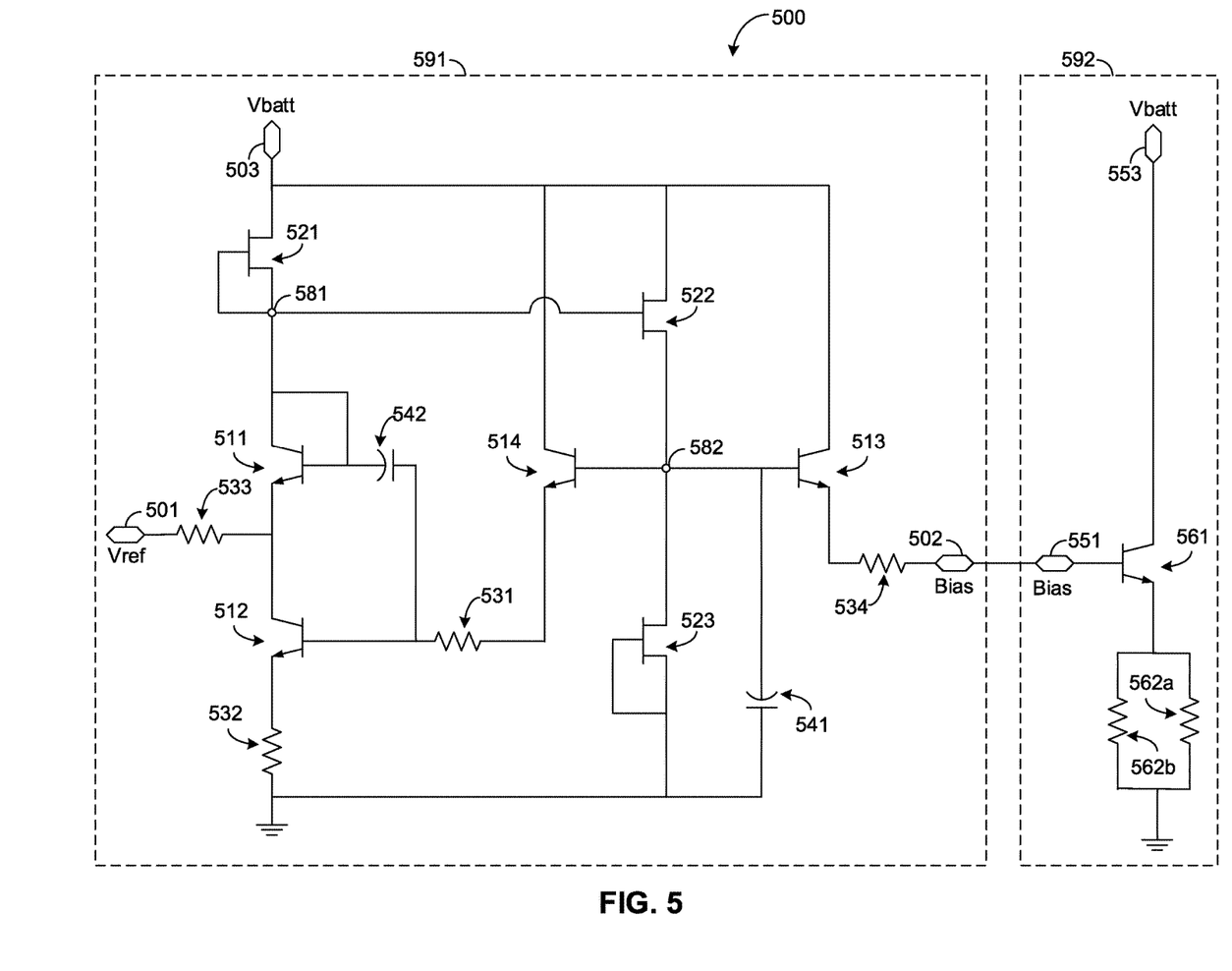
FIG. 5 shows a power amplification configuration including a bias circuit that can reduce a dependence on transistor beta.

FIG. 5 shows a power amplification configuration 500 including a bias circuit 591 that can reduce a dependence on transistor beta. The power amplifier configuration 500 includes a bias circuit 591 configured to provide a bias signal to a power amplifier 592.

The bias circuit 591 includes an input port 501 configured to receive a reference voltage and an output port 502 configured to supply a bias signal (e.g., a bias voltage and/or a bias current). The bias circuit 591 is powered by voltage from a battery (Vbatt) or other source received at a power port 503. The bias circuit 591 can include an enable circuit component (such as the enable circuit component 484 of FIG. 4) coupled to the input port 501.

The bias circuit 591 includes an emitter follower transistor 513 and an emitter follower mirror transistor 514 coupled to form a mirror configuration. In particular, the emitter follower transistor 513 and the emitter follower mirror transistor 514 are coupled by their respective bases to form the mirror configuration. The emitter follower transistor 513 is configured to provide the bias signal for the power amplifier 592 at the output port 502. In particular, the emitter of the emitter follower transistor 513 is coupled to the output port 502 via an output resistor 534.

The bias circuit 591 further includes a reference transistor 512 configured to mirror an amplifying transistor 561 of the power amplifier 592. Whereas the emitter follower transistor 513 is configured to provide the bias signal at the output port 502 via an output resistor 534, the emitter follower mirror transistor 514 is configured to provide a mirror bias signal to the reference transistor 512 via a reference-base resistor 531.

The reference transistor 512 receives an input signal at its collector as a result of the reference voltage received at the input port 501 and an input resistor 533. The reference transistor 512 is biased by the mirror bias signal and a current flows through the reference transistor 512 and a reference-emitter resistor 532. The current flowing through the amplifying transistor 561 is proportional to the current flowing through the reference transistor 512.

The bias circuit 591 further includes a source follower FET 522 configured to provide a base current to the bases of each of the emitter follower transistor 514 and the emitter follower mirror transistor 513. The source follower FET 522 is configured as a zero shift buffer. In particular, the voltage at a node 581 coupled to the gate of the source follower FET 522 is approximately equal to the voltage at a node 582 coupled to the source of the source follower FET 522. In some embodiments, the voltage at the node 582 is approximately twice a base-emitter voltage (2Vbe) of the amplifying transistor 561. The bias circuit 591 further includes a second FET 523 (in a diode configuration) having a drain coupled to the node 582 and a third FET 521 (also in a diode configuration) having a drain coupled to the power port 503.

The bias circuit 591 further includes a boost capacitor 541 coupled between the node 582 and the ground potential.

The bias circuit 591 further includes a transistor 511 (in a diode configuration) coupled between the collector of the reference transistor 512 and the node 581 and a capacitor 542 coupled between the base of the reference transistor 512 and the node 581.

The power amplifier 592 includes a bias port 551 for receiving the bias signal and a power port 553 for receiving a supply voltage (e.g., a voltage for a battery. The power amplifier 592 includes the amplifying transistor 561 with a base coupled to the bias port 551, a collector coupled to the power port 553, and an emitter coupled to the ground potential via a pair of resistors 562a-562b coupled in parallel.

Thus, in the example bias circuit 592 of FIG. 5, the amplifying transistor 561 is mirrored by a reference cell (e.g., the reference transistor 512). The emitter follower transistor 513 feeding the amplifying transistor 561 is mirrored by a scaled-down emitter follower mirror transistor 514 feeding the reference transistor 512.

The source follower FET 522 is configured as a zero shift buffer. The drain current can be set by an identical FET device at the source (e.g., second FET 523). The base currents into the emitter follower transistor 513 and emitter follower mirror transistor 514 may be negligible. Both FETS operate at the same point of their IV curve (e.g., Vgs=0) and temperature variation is almost completely compensated.

The sense voltage (at the gate of the source follower FET 522) is shifted down by Vbe by means of diode-connected transistor (e.g. transistor 511). The source follower FET 522 sets the base current into the node 582 to maintain collector voltage of the reference transistor 514 at Vbe and collector current equal to a reference current. Thus, the Vref headroom issue is eliminated and a voltage reference can be used at the input port 501 without a CMOS current source.

Figure 6:
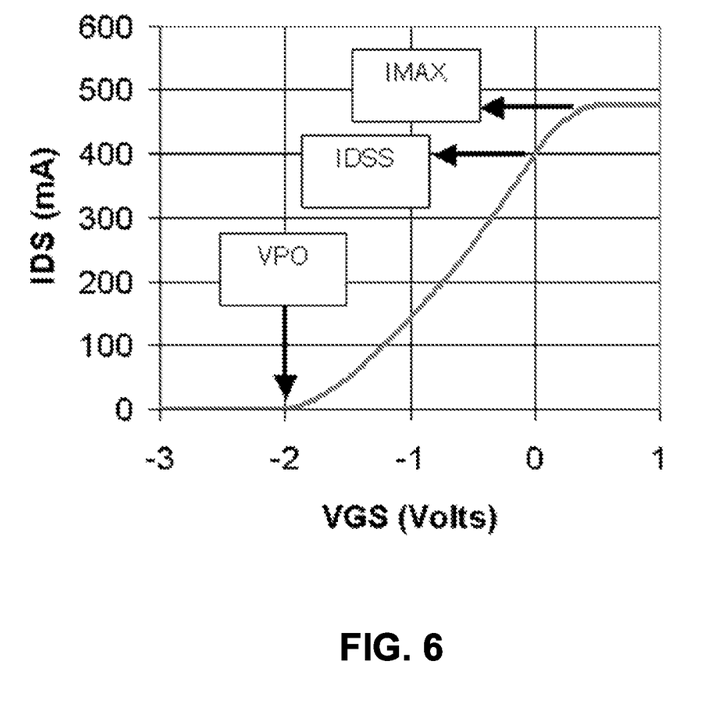
FIG. 6 shows an example transfer function of the source follower FET of FIG. 5.

FIG. 6 shows an example transfer function of the source follower FET 522. As shown in FIG. 6, the current from the drain to the source of the source follower FET 521 is linearly proportional to the voltage across the gate and source of the source follower FET 521, at least between approximately −2.0 V and 0.5 V.

Figure 7:
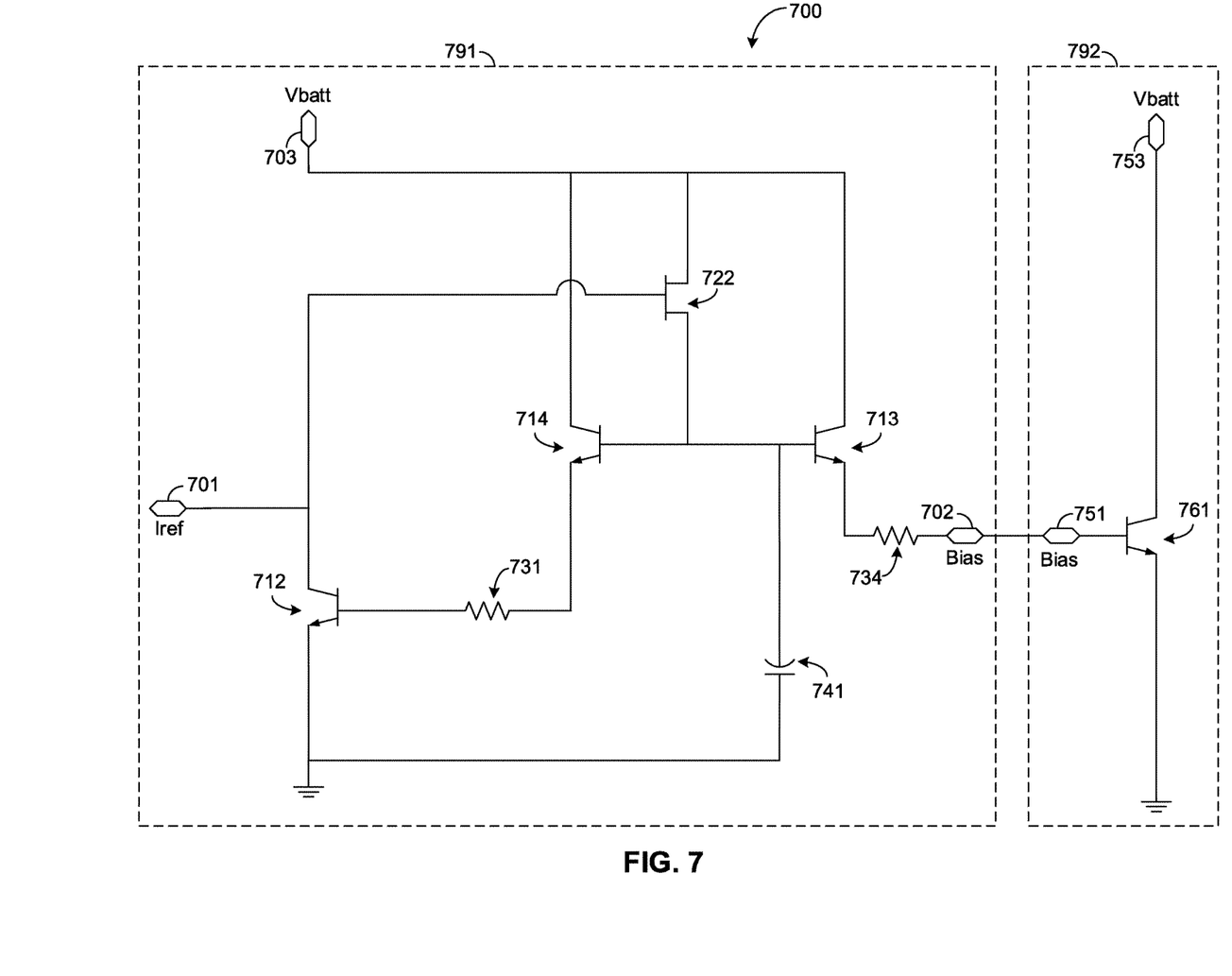
FIG. 7 shows a simplified power amplification configuration including a bias circuit that can reduce a dependence on transistor beta.

FIG. 7 shows a simplified power amplification configuration 700 including a bias circuit 791 that can reduce a dependence on transistor beta. The configuration 700 of FIG. 7 may be particular suitable when the input provided at the input port 701 is a reference current provided by a CMOS current source. The configuration 500 of FIG. 5 may be particularly suitable when the input provided at the input port 501 is a reference voltage.

The power amplifier configuration 700 includes a bias circuit 791 configured to provide a bias signal to a power amplifier 792.

The bias circuit 791 includes an input port 701 configured to receive a reference current and an output port 702 configured to supply a bias signal (e.g., a bias voltage and/or a bias current). The bias circuit 791 is powered by voltage from a battery (Vbatt) or other source received at a power port 703. The bias circuit 791 can include an enable circuit component (such as the enable circuit component 484 of FIG. 4) coupled to the input port 701.

The bias circuit 791 includes an emitter follower transistor 713 and an emitter follower mirror transistor 714 coupled to form a mirror configuration. In particular, the emitter follower transistor 713 and the emitter follower mirror transistor 714 are coupled by their respective bases to form the mirror configuration. The emitter follower transistor 513 is configured to provide the bias signal for the power amplifier 792 at the output port 702. In particular, the emitter of the emitter follower transistor 713 is coupled to the output port 702 via an output resistor 734.

The bias circuit 791 further includes a reference transistor 712 configured to mirror an amplifying transistor 761 of the power amplifier 792. Whereas the emitter follower transistor 713 is configured to provide the bias signal at the output port 702 via an output resistor 734, the emitter follower mirror transistor 714 is configured to provide a mirror bias signal to the reference transistor 712 via a reference-base resistor 731.

The reference current received at the input port 701 flows through the reference transistor 712. The current flowing through the amplifying transistor 761 is proportional to the current flowing through the reference transistor 712.

The bias circuit 791 further includes a source follower FET 722 configured to provide a base current to the bases of each of the emitter follower transistor 714 and the emitter follower mirror transistor 713. In some embodiments, the voltage at the node at the source of the source follower FET 722 (and the bases of the emitter follower transistor 713 and emitter follower mirror transistor 714) is approximately twice a base-emitter voltage (2Vbe) of the amplifying transistor 761.

The bias circuit 591 further includes a boost capacitor 741 coupled between the node 582 and the ground potential.

The power amplifier 792 includes a bias port 751 for receiving the bias signal and a power port 753 for receiving a supply voltage (e.g., a voltage for a battery. The power amplifier 792 includes the amplifying transistor 761 with a base coupled to the bias port 751, a collector coupled to the power port 753, and an emitter coupled to the ground potential.

Figure 8:
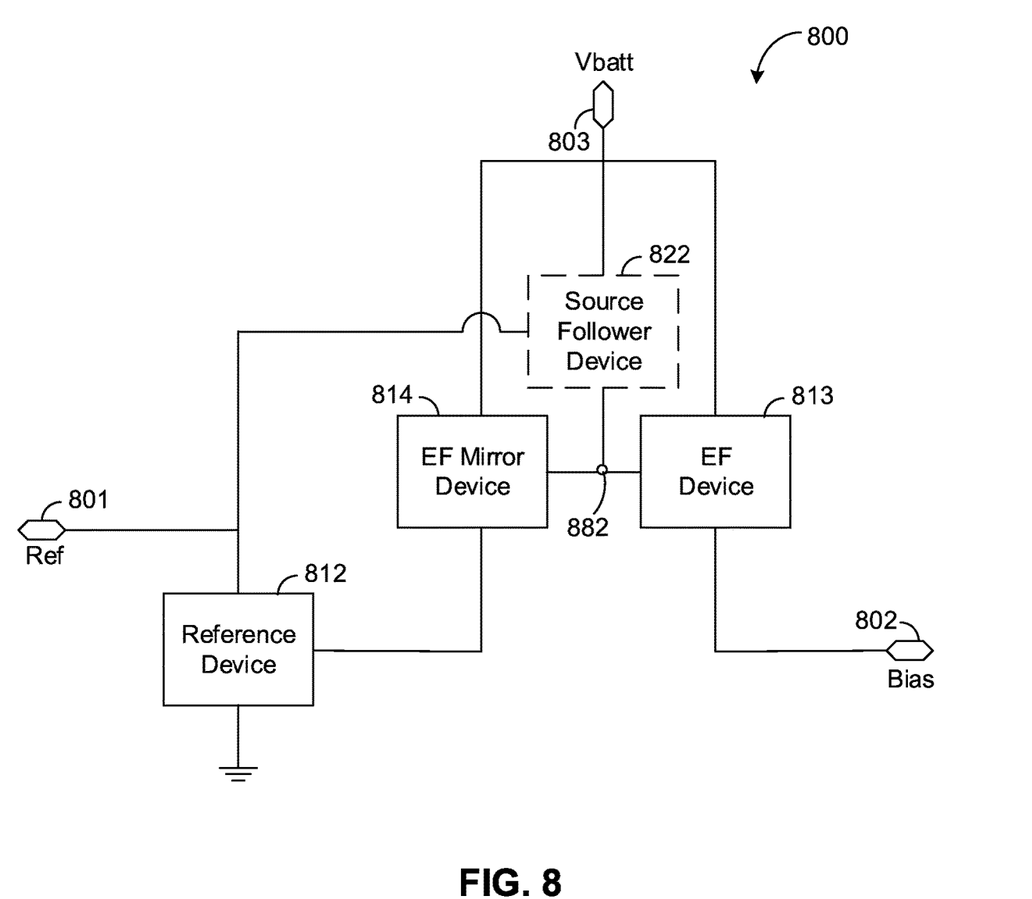
FIG. 8 shows a block diagram of an example 2Vbe power amplifier bias circuit.

FIG. 8 shows a block diagram of an example 2Vbe power amplifier bias circuit 800. The bias circuit 800 includes an input port 801 configured to reference an input signal (e.g., a reference voltage or a reference current) and an output port 802 configured to provide a bias signal (e.g., a bias voltage or a bias current) to a power amplifier including an amplifying device. The amplifying device can include an amplifying transistor (e.g., as shown in FIGS. 5 and 7). The bias circuit 800 further includes a power port 803 for receiving a supply voltage (e.g., from a battery).

The bias circuit 800 includes an emitter follower device 813 and an emitter follower mirror device 814 coupled to form a mirror configuration. The emitter follower device 813 is configured to provide the bias signal for the power amplifier at the output port 802. The bias circuit further includes a reference device 812 configured to mirror the amplifying device of the power amplifier. Thus, in some embodiments, the current through the amplifying device is proportional to the current through the reference device 812. The emitter follower mirror device 814 is coupled to provide a mirror bias signal to the reference device 812.

In some embodiments, the emitter follower device 813 includes an emitter follower transistor (e.g., the emitter follower transistor 513 of FIG. 5 or the emitter follower transistor 713 of FIG. 7) and the emitter follower mirror device 814 includes an emitter follower transistor (e.g., the emitter follower mirror transistor 514 of FIG. 5 or the emitter follower mirror transistor 714 of FIG. 7). The emitter follower transistor and emitter follower mirror transistor can be coupled by the respective bases to form the mirror configuration.

In some embodiments, the reference device 812 includes a reference transistor (e.g., the reference transistor 512 of FIG. 5 or the reference transistor 712 of FIG. 7) configured to mirror an amplifying transistor of the amplifying device. In particular, in some embodiments, the current through the amplifying transistor is proportional to the current through the reference transistor.

In some embodiments, the emitter follower device 813 is configured to provide the bias signal to a base of the amplifying transistor and the emitter follower mirror device 814 is configured to provide the mirror bias signal to a base of the reference transistor.

In some embodiments, a node 882 between the emitter follower device 813 and the emitter follower mirror device 814 has a voltage of approximately twice a base-emitter voltage (2Vbe) of the amplifying transistor.

The bias circuit 800 optionally includes a source follower device 822 having an output coupled to the node. The source follower device 822 can be configured as a zero shift buffer. In some embodiments, the source follower device 822 can be configured to provide a current to the node 882. In some embodiments, the source follower device 822 includes a source follower FET (e.g., the source follower FET 522 of FIG. 5 or the source follower FET 722 of FIG. 7).

Figure 9:
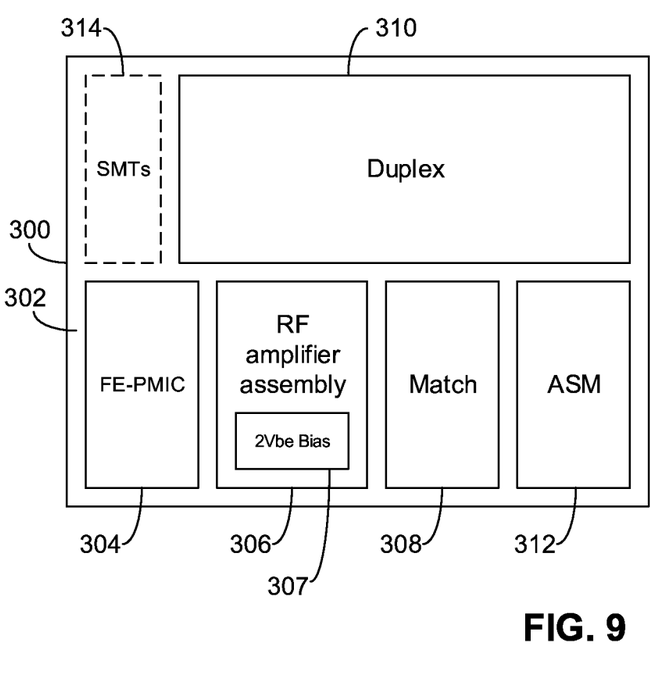
FIG. 9 depicts a module having one or more features as described herein.

FIG. 9 shows that in some embodiments, some or all of power amplification systems (e.g., that shown in FIG. 5, 7, or 8) can be implemented in a module. Such a module can be, for example, a front-end module (FEM). In the example of FIG. 8, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. The power amplifier assembly 306 may include a 2Vbe bias circuit 307 such as that shown in FIG. 5, 7, or 8. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
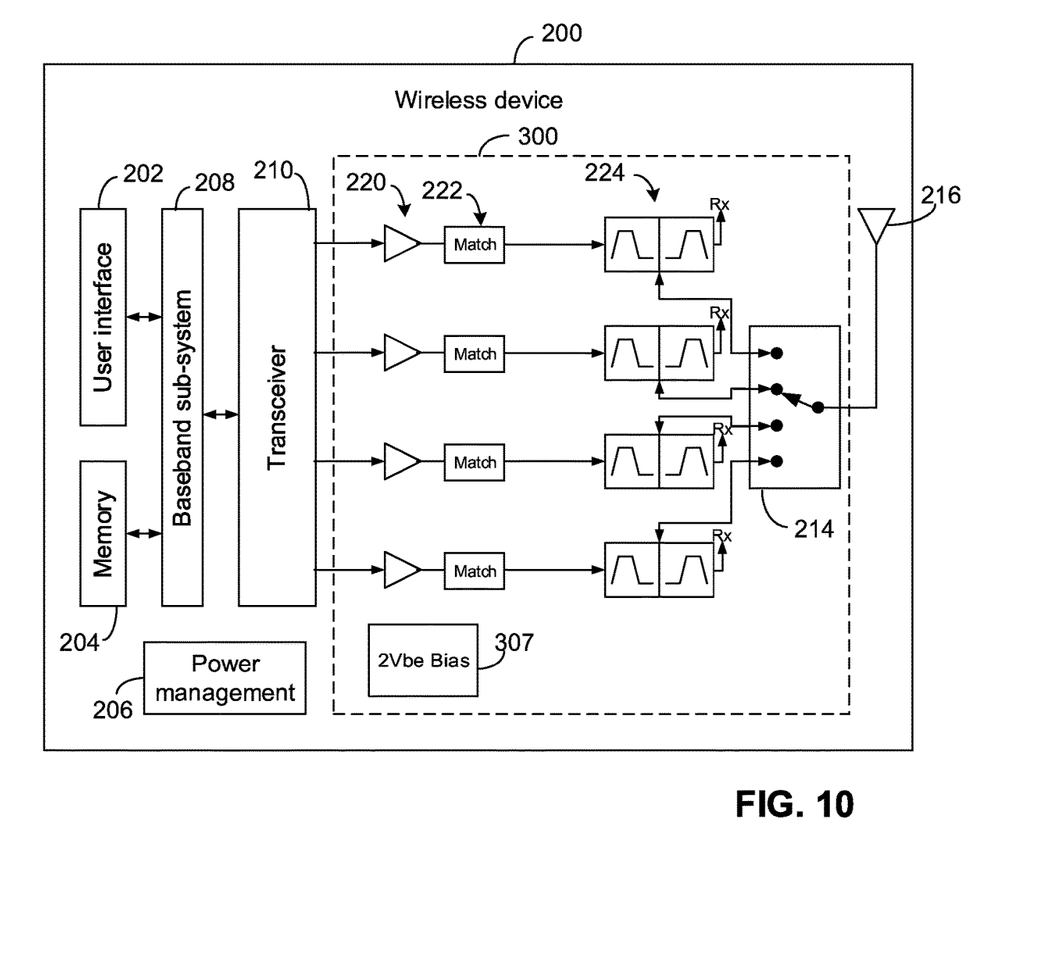
FIG. 10 depicts a wireless device having one or more features described herein.

FIG. 10 depicts an example wireless device 200 having one or more advantageous features described herein. In the context of a module having one or more features as described herein, such a module can be generally depicted by a dashed box 300, and can be implemented as, for example, a front-end module (FEM).

Referring to FIG. 10, power amplifiers (PAs) 220 can receive their respective RF signals from a transceiver 210 that can be configured and operated in known manners to generate RF signals to be amplified and transmitted, and to process received signals. The transceiver 210 is shown to interact with a baseband sub-system 208 that is configured to provide conversion between data and/or voice signals suitable for a user and RF signals suitable for the transceiver 210. The transceiver 210 can also be in communication with a power management component 206 that is configured to manage power for the operation of the wireless device 200. Such power management can also control operations of the baseband sub-system 208 and the module 300.

The baseband sub-system 208 is shown to be connected to a user interface 202 to facilitate various input and output of voice and/or data provided to and received from the user. The baseband sub-system 208 can also be connected to a memory 204 that is configured to store data and/or instructions to facilitate the operation of the wireless device, and/or to provide storage of information for the user.

In the example wireless device 200, outputs of the PAs 220 are shown to be matched (via respective match circuits 222) and routed to their respective duplexers 224. The power amplifiers 220 may be biased by a 2Vbe bias circuit 307 such as that shown in FIG. 5, 7, or 8. Such amplified and filtered signals can be routed to an antenna 216 through an antenna switch 214 for transmission. In some embodiments, the duplexers 224 can allow transmit and receive operations to be performed simultaneously using a common antenna (e.g., 216). In FIG. 10, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) module comprising:
a packaging substrate configured to receive a plurality of components; and
a power amplification system implemented on the packaging substrate, the power amplification system including an amplifying device and a power amplifier bias circuit, the power amplifier bias circuit configured to provide a bias signal to the amplifying device, the power amplifier bias circuit including an emitter follower device and an emitter follower mirror device coupled to form a mirror configuration, the emitter follower device being configured to provide a bias signal for a power amplifier at an output port; the power amplifier bias circuit further including a reference device including a reference transistor configured to mirror an amplifying transistor of the amplifying device of the power amplifier, the emitter follower mirror device being configured to provide a mirror bias signal to the reference device, a node between the emitter follower device and the emitter follower mirror device having a voltage of approximately twice a base-emitter voltage (2Vbe) of the amplifying transistor; the power amplifier bias circuit further including a capacitor coupled between the node and a ground potential; and the power amplifier bias circuit further including a source follower device coupled to the node between the emitter follower device and the emitter follower mirror device.

2. The RF module of claim 1 wherein the emitter follower device is configured to provide the bias signal to a base of the amplifying transistor.

3. The RF module of claim 1 wherein the emitter follower device includes an emitter follower transistor, the emitter follower mirror device includes an emitter follower mirror transistor, and the emitter follower transistor and emitter follower mirror transistor are coupled by their respective bases to form the mirror configuration.

4. The RF module of claim 1 wherein the power amplifier bias circuit further includes a reference-base resistor coupled between the emitter follower mirror device and the reference device.

5. A radio-frequency (RF) module comprising:
a packaging substrate configured to receive a plurality of components; and
a power amplification system implemented on the packaging substrate, the power amplification system including an amplifying device and a power amplifier bias circuit, the power amplifier bias circuit configured to provide a bias signal to the amplifying device, the power amplifier bias circuit including an emitter follower device and an emitter follower mirror device coupled to form a mirror configuration, the emitter follower device being configured to provide a bias signal for a power amplifier at an output port; the power amplifier bias circuit further including a reference device including a reference transistor configured to mirror an amplifying transistor of the amplifying device of the power amplifier, the emitter follower mirror device being configured to provide a mirror bias signal to the reference device, a node between the emitter follower device and the emitter follower mirror device having a voltage of approximately twice a base-emitter voltage (2Vbe) of the amplifying transistor; the power amplifier bias circuit further including a capacitor coupled between the node and a ground potential; and the power amplifier bias circuit further including an enable circuit coupled between an input port of the power amplifier bias circuit and the reference device.

6. The RF module of claim 5 wherein the emitter follower device is configured to provide the bias signal to a base of the amplifying transistor.

7. The RF module of claim 5 wherein the emitter follower device includes an emitter follower transistor, the emitter follower mirror device includes an emitter follower mirror transistor, and the emitter follower transistor and emitter follower mirror transistor are coupled by their respective bases to form the mirror configuration.

8. The RF module of claim 5 wherein the power amplifier bias circuit further includes a reference-base resistor coupled between the emitter follower mirror device and the reference device.

9. The RF module of claim 5 wherein the emitter follower device is configured to provide the bias signal to a base of the amplifying transistor and the emitter follower mirror device is configured to provide the mirror bias signal to a base of the reference transistor.

10. The RF module of claim 5 wherein the power amplifier bias circuit further includes a source follower device having an output coupled to the node.

11. The RF module of claim 10 wherein the source follower device is configured as a zero shift buffer.

12. The RF module of claim 11 wherein the source follower device includes a source follower field-effect transistor (FET).

13. A radio-frequency (RF) module comprising:
a packaging substrate configured to receive a plurality of components; and
a power amplification system implemented on the packaging substrate, the power amplification system including an amplifying device and a power amplifier bias circuit, the power amplifier bias circuit configured to provide a bias signal to the amplifying device, the power amplifier bias circuit including an emitter follower device and an emitter follower mirror device coupled to form a mirror configuration, the emitter follower device being configured to provide a bias signal for a power amplifier at an output port; the power amplifier bias circuit further including a reference device including a reference transistor configured to mirror an amplifying transistor of the amplifying device of the power amplifier, the emitter follower mirror device being configured to provide a mirror bias signal to the reference device, a node between the emitter follower device and the emitter follower mirror device having a voltage of approximately twice a base-emitter voltage (2Vbe) of the amplifying transistor; the power amplifier bias circuit further including a capacitor coupled between the node and a ground potential; and the power amplifier bias circuit further including an output resistor coupled between the emitter follower device and the output port.

14. The RF module of claim 13 wherein the emitter follower device is configured to provide the bias signal to a base of the amplifying transistor.

15. The RF module of claim 13 wherein the emitter follower device includes an emitter follower transistor, the emitter follower mirror device includes an emitter follower mirror transistor, and the emitter follower transistor and emitter follower mirror transistor are coupled by their respective bases to form the mirror configuration.

16. The RF module of claim 13 wherein the power amplifier bias circuit further includes a reference-base resistor coupled between the emitter follower mirror device and the reference device.

17. The RF module of claim 13 wherein the emitter follower device is configured to provide the bias signal to a base of the amplifying transistor and the emitter follower mirror device is configured to provide the mirror bias signal to a base of the reference transistor.

18. The RF module of claim 13 wherein the power amplifier bias circuit further includes a source follower device having an output coupled to the node.

19. The RF module of claim 18 wherein the source follower device is configured as a zero shift buffer.

20. The RF module of claim 19 wherein the source follower device includes a source follower field-effect transistor (FET).

\* \* \* \* \*